US007589521B2

(12) United States Patent
Schubring et al.

(10) Patent No.: US 7,589,521 B2
(45) Date of Patent: Sep. 15, 2009

(54) UNIVERSAL COVER FOR A BURN-IN SOCKET

(75) Inventors: Paul J. Schubring, Gilbert, AZ (US); Victor W. Henckel, Seattle, WA (US); Todd R. Coons, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 11/823,517

(22) Filed: Jun. 28, 2007

(65) Prior Publication Data

US 2009/0002007 A1 Jan. 1, 2009

(51) Int. Cl.
*G01R 31/28* (2006.01)
*G01R 31/02* (2006.01)

(52) U.S. Cl. .................................... 324/158.1; 324/755

(58) Field of Classification Search ............. 324/158.1, 324/754–765

See application file for complete search history.

(56) References Cited

U.S. PATENT DOCUMENTS 4,321,533 A * 3/1982 Matrone ..................... 324/757
5,027,063 A * 6/1991 Letourneau ................. 324/754
5,469,074 A * 11/1995 Drabenstadt et al. ........ 324/758
6,741,089 B2 * 5/2004 Conroy ........................ 324/755
6,956,392 B2 * 10/2005 Wright ........................ 324/760
6,965,246 B2 * 11/2005 Gattuso et al. .............. 324/760
6,998,862 B2 * 2/2006 Cram .......................... 324/755
2006/0290366 A1 12/2006 Kon et al. ................... 324/760

OTHER PUBLICATIONS

Harold Hamilton and Jeff Urbanek, "Burn-In for High-Power Devices,"Mar. 2006, pp. 1-6.

Antares—Advanced Test Technologies, "Single Site iSocket™ (SSiS)," Sep. 25, 2006, 1 page.

* cited by examiner

*Primary Examiner*—Ha Tran T Nguyen
*Assistant Examiner*—Joshua Benitez
(74) *Attorney, Agent, or Firm*—Trop, Pruner & Hu, P.C.

(57) ABSTRACT

In one embodiment, the present invention includes a universal cover to be adapted to burn-in sockets, where at least some of the burn-in sockets have different dimensions. In this way, the universal cover enables an actuator plate of an actuator system having a fixed configuration of actuation members to open and close burn-in socket covers of different form factors. Other embodiments are described and claimed.

6 Claims, 4 Drawing Sheets

80
75
75
35
35
10
51
50
60

UNIVERSAL COVER FOR A BURN-IN SOCKET

BACKGROUND

Many semiconductor devices such as processors, chipsets, and so forth often go through extensive testing after manufacture to verify performance levels and prevent devices likely to fail from being shipped. To perform high volume manufacturing (HVM) testing, so-called burn-in boards are used which include one or more burn-in sockets in which completed semiconductor devices can be inserted to perform the burn-in testing.

To insert semiconductor devices into the burn-in sockets, typically an actuator system is used, in connection with a so-called pick and place tool. First, the actuator system, which includes numerous pins that are adapted to be positioned to make contact with a top portion of a cover of the burn-in socket, may be placed over the burn-in socket. Then the actuator system opens a cover of the burn-in socket such as a clamshell-shaped cover to enable insertion of the semiconductor device by the pick and place tool. The cover is then replaced to enable adaptation of the semiconductor device in the burn-in socket for operation of the burn-in test.

Because different sizes of semiconductor devices require differently size burn-in sockets, extensive tooling of an actuator system is often required. For example, when replacing socket form factors, actuator pins may need to be switched from hole to hole. Certain systems can use over a thousand such actuator pins, requiring excessive labor intensive operations to move pin positions, both raising costs and reducing amount of up time for a burn-in system.

DETAILED DESCRIPTION

In various embodiments, a universal cover may be provided to establish a standardized burn-in socket (BIS) cover touchdown area to enable a single actuator assembly to be used for automatic loading and unloading of semiconductor devices in a BIS. While the scope of the present invention is not limited in this regard, in various embodiments the standardized or universal cover may be formed of a plastic such as an injection molded plastic, a metal or other such resilient material. Accordingly, embodiments may provide for a standardized universal BIS cover to enable a single load/unload actuator plate of an actuator assembly to be used for sockets having different body sizes. Note that while a single sized top portion of a burn-in cover may be provided, embodiments may enable different dimensions on a bottom portion of the universal cover to enable mating with multiple different burn-in socket sizes, as will be discussed further below.

Figure 1:
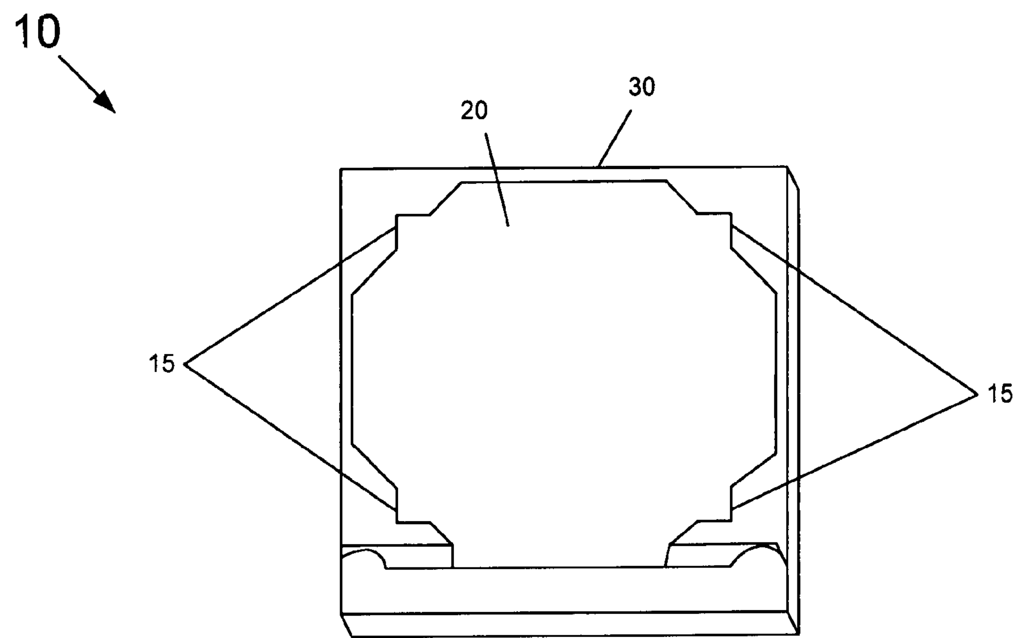
FIG. 1 is a plan view of a universal cover in accordance with one embodiment of the present invention.

Referring now to FIG. 1, shown is a plan view of a universal cover in accordance with one embodiment of the present invention. As shown in FIG. 1, cover 10 may be a three dimensional frame having an open portion 20 and a peripheral frame portion 30. As shown in FIG. 1, each corner of frame portion 30 may include a tab member 15 to enable touch down of corresponding actuator pins of an actuator assembly. Note that in different embodiments, tabs 15 may be formed of insert molded metal or injection molded plastic to provide a contact area for touch down of actuator pins. More specifically, by the provision of a universal cover, an actuator assembly may have a fixed set of pins to provide for load/unload operations using a single actuator plate with fixed actuator pin locations.

While shown in the embodiment of FIG. 1 as including four such tabs, the scope of the present invention is not limited in this regard, and different numbers (i.e., greater or fewer) may be present in different embodiments. Further, in different implementations different orientations and shapes of cutouts and so forth within frame portion 30 may be provided to enable mating with actuator pins or other actuator mechanisms of different actuator assemblies.

Figure 5A:
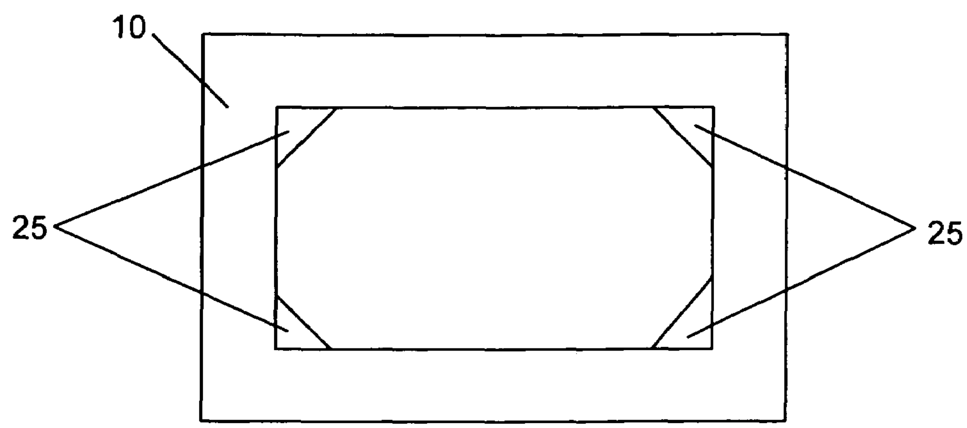
FIGS. 5A, 5B, and 5C are top plan views of a universal cover with differently sized burn-in sockets in accordance with an embodiment of the present invention.
Figure 5B:
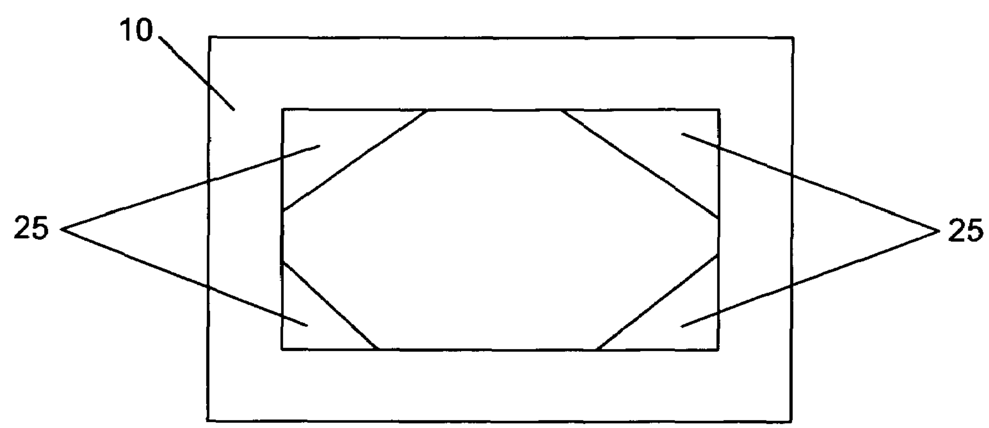
Figure 5C:
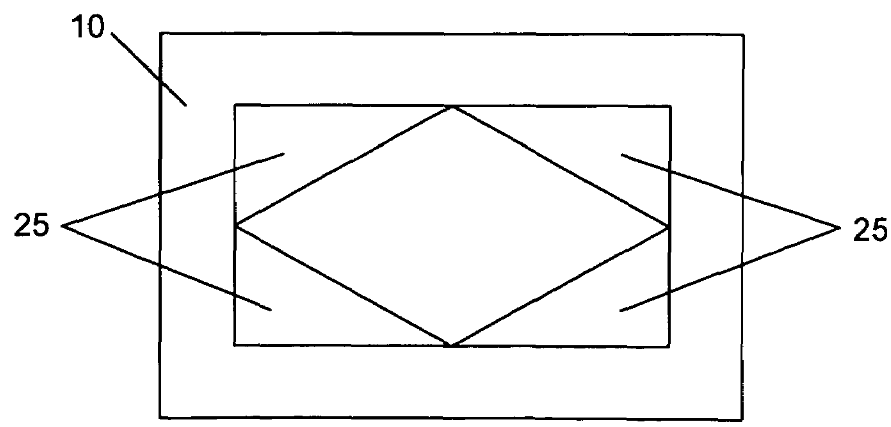

In many different implementations, multiple universal covers may be provided having the same exterior dimensions and the same top cover dimensions (i.e., the top portion shown in FIG. 1). However, as seen in FIGS. 5A. 5B. 5C, to enable a commonly dimensioned universal cover 10 with differently sized burn-in sockets, a bottom portion of the different universal covers may take different dimensions to enable contact of the universal covers with differently sized burn-in sockets. For example, touch points 25 may extend to different extents into a central void of cover 10.

Figure 2:
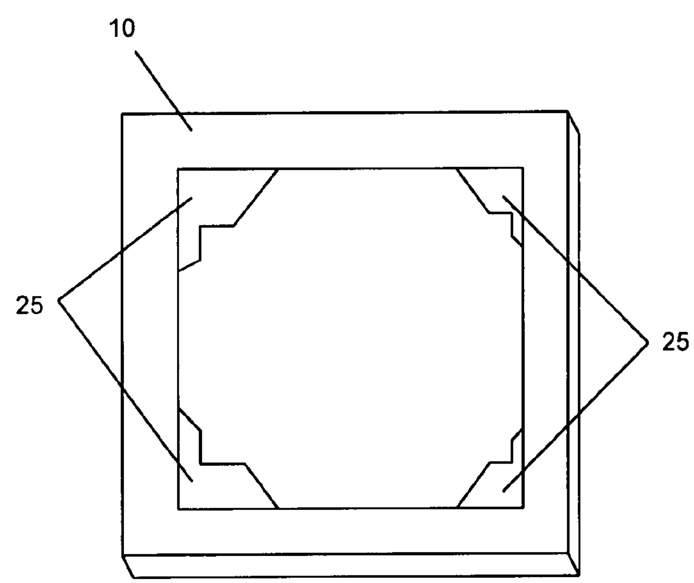
FIG. 2 is a plan view of a backside of a universal cover in accordance with an embodiment of the present invention.

Referring now to FIG. 2, shown is a plan view of a backside of a universal cover in accordance with an embodiment of the present invention. As shown in FIG. 2, cover 10 has a backside that includes four touch points 25 with which a burn-in socket may make contact. Because burn-in sockets may come in differently sized formats such as small form factor, medium form factor, large form factor and so forth, these touch points may be dimensioned differently and may extend further into the open space 20 of cover 10, depending on a size of the BIS with which it is to be adapted. In different implementations, a universal cover may be mounted to a corresponding BIS or may be removably coupled thereto during testing operations.

Figure 3:
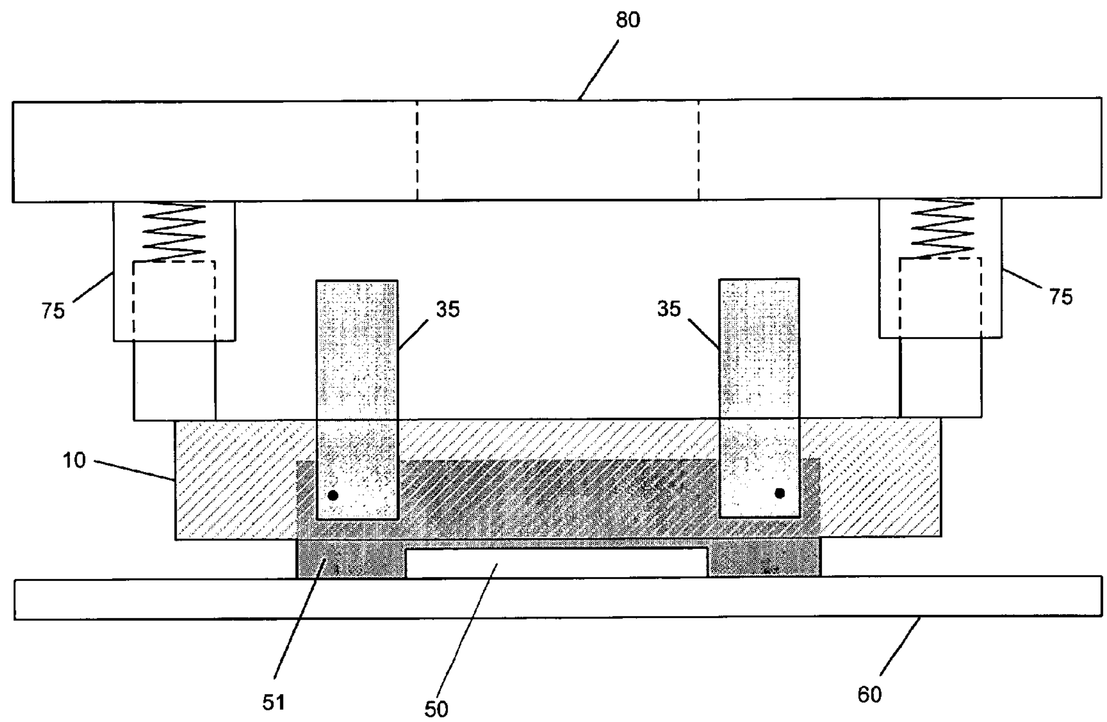
FIG. 3 is a side view of a universal cover adapted to a burn-in socket in accordance with an embodiment of the present invention.

Referring now to FIG. 3, shown is a side view of a universal cover adapted to a burn-in socket in accordance with an embodiment of the present invention. As shown in FIG. 3, a burn-in socket 50 may be adapted to a burn-in board 60. For example, burn-in socket 50 may be soldered or otherwise affixed to burn-in board 60. Burn-in board 60 may provide power connections from a power supply (not shown in FIG. 3) of a burn-in system to burn-in socket 50 to enable burn-in testing. Burn-in board 60 may further enable data connections for testing during the burn-in test. While not shown in FIG. 3, understand that various other components may be present in a burn-in system such as a heater assembly which may be closely coupled to the burn-in socket or burn-in board to enable testing at high temperatures. Furthermore, while shown with only a single burn-in socket on burn-in board 60, the scope of the present invention is not limited in this regard and embodiments may be used in systems where multiple burn-in sockets are adapted on a single burn-in board. Furthermore, in such implementations different burn-in sockets having different dimensions may be adapted on a single burn-in board and testing may be performed for differently sized semiconductor devices in these differently sized burn-in sockets while using universal covers in accordance with an embodiment of the present invention to enable a fixed actuator assembly having fixed pins coupled to actuator plates of a single dimension.

Referring still to FIG. 3, adapted above BIS 50 is a universal cover 10 in accordance with an embodiment of the present invention. As shown in FIG. 3, universal cover 10 may have an expanded cover size such that cover 10 extends laterally beyond a dimension of BIS 50. Note that contact may be made on an underside of cover 10 at touch points. Burn-in socket 50 may include a cover which may be opened to enable coupling of a semiconductor device under test (DUT) therein. As described above, the DUT may be coupled into BIS 50 using a pick and place tool after the cover is actuated open using an actuator assembly. A plurality of latches 35 may be connected between BIS 50 and cover 10 by a given mechanism such as links. As cover 10 goes down, the mechanism opens up latches 35.

Also shown in FIG. 3, a plurality of actuator pins 75 are coupled to an actuator plate 80. Actuator pins 75 may contact universal cover 10 during actuation to enable opening of both universal cover 10 and the BIS cover 51 for insertion and then later removal of the DUT. FIG. 3 shows cover 10 actuated by pins 75. Consequently, cover 10 has actuated socket cover 51 thereby pivoting latches 35 open so a semiconductor package may be inserted/removed from socket 50. Note that during burn-in testing, the actuator assembly may not be present, and other burn-in system components such as heater assemblies, control assemblies and so forth may be located in close contact with BIS 50. While shown with this particular implementation in the embodiments of FIGS. 1-3, understand the scope of the present invention is not limited in this regard and a universal cover may take different forms in other embodiments.

Figure 4:
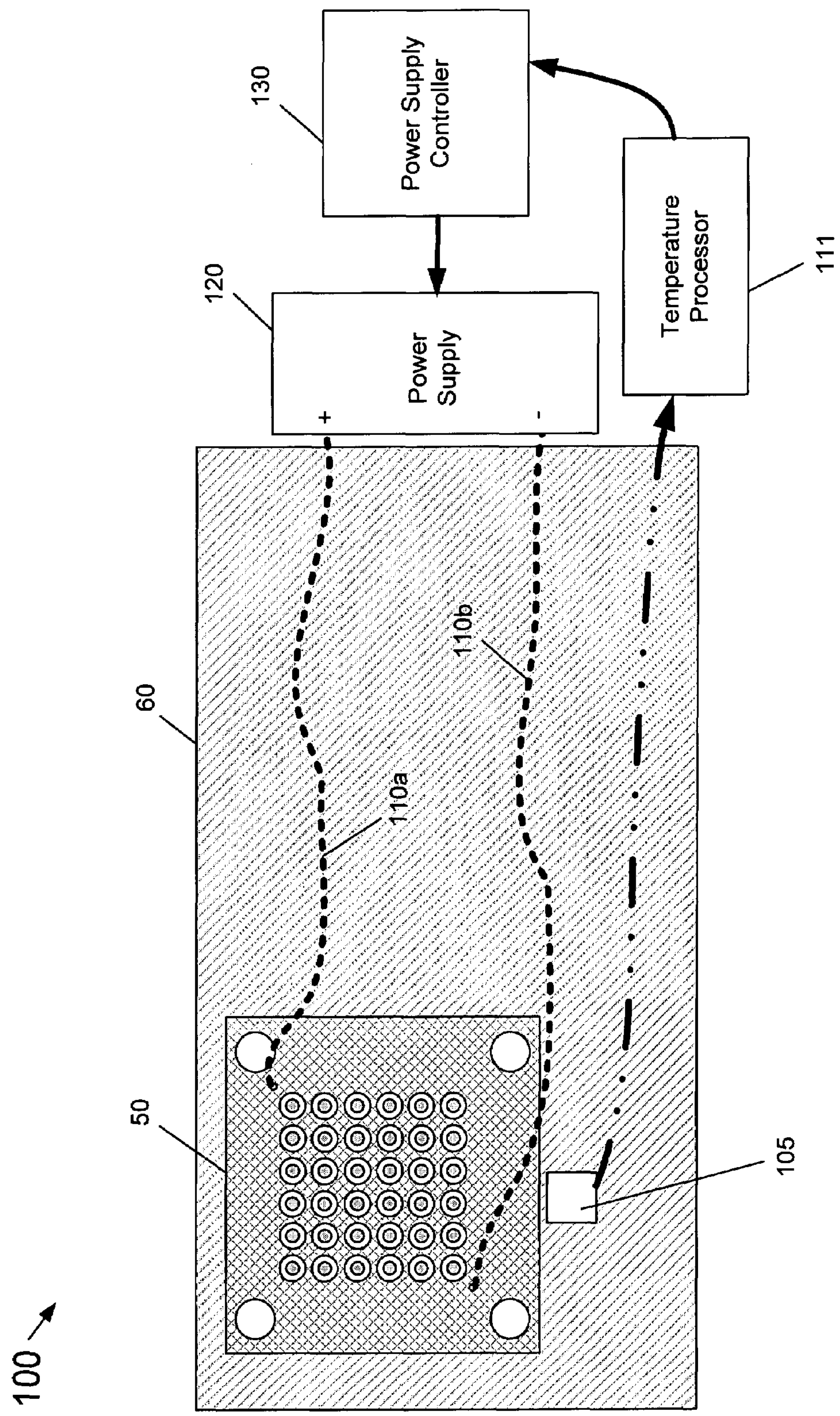
FIG. 4 is a block diagram of a burn-in control system in accordance with an embodiment of the present invention.

Referring now to FIG. 4, shown is a block diagram of a burn-in control system in accordance with an embodiment of the present invention. As shown in FIG. 4, burn-in control system 100 may be used to individually monitor and control the burn-in testing of each of multiple burn-in sockets adapted to a burn-in board. While shown in the embodiment of FIG. 4 with only a single such burn-in socket location for ease of illustration, understand the scope of the present invention is not limited in this regard and in various embodiments many burn-in sockets may be present. Note that the same reference numerals used in FIGS. 1-3 are used in FIG. 4 to refer to the same components. As shown in FIG. 4, BIB 60 includes a BIS 50 that is coupled to, respectively, positive and negative voltage supply lines $\mathbf{110}_a$ and $\mathbf{110}_b$ as well as data and control lines (not shown in FIG. 4). Accordingly, a semiconductor DUT receives power from a power supply 120 that in turn is controlled by a power supply controller 130.

Other components may be present in a burn-in system such as a temperature sensor 105, which may be provide feedback information to a temperature processor 111. Based on this information, temperature processor 111 may process the data and send commands to a heater assembly (not shown in FIG. 4).

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:

a universal cover to couple to burn-in sockets, wherein at least some of the burn-in sockets have different widths, wherein the universal cover has a first portion to mate with actuator members of an actuator plate of an actuator system, the actuator members having a fixed configuration, wherein the universal cover is to enable opening and closing of a cover of a corresponding burn-in socket by the actuator members, the first portion extending laterally beyond a dimension of the burn-in socket.

2. The apparatus of claim 1, wherein the universal cover comprises a frame having a plurality of tab members on the first portion to mate with the corresponding actuator members.

3. The apparatus of claim 2, wherein the universal cover has a second portion to mate with a top portion of the cover of the corresponding burn-in socket, wherein the top portion includes a plurality of touch members to enable contact with the cover of the corresponding burn-in socket.

4. The apparatus of claim 3, further comprising a plurality of universal covers, each having common external dimensions and wherein the first portion is commonly dimensioned, wherein each of the plurality of universal covers has a differently dimensioned second portion to enable mating with a corresponding burn-in socket of a different dimension.

5. The apparatus of claim 2, wherein the plurality of tab members comprises an injection molded material, and wherein the actuator members comprise pins.

6. The apparatus of claim 2, wherein the universal cover is to enable a burn-in socket having a small form factor to be actuated by the actuator members, wherein the actuator plate is of a large form factor.

* * * * *